(12) United States Patent
Kurachi et al.

(10) Patent No.: US 7,442,999 B2
(45) Date of Patent: Oct. 28, 2008

(54) SEMICONDUCTOR SUBSTRATE, SUBSTRATE FOR SEMICONDUCTOR CRYSTAL GROWTH, SEMICONDUCTOR DEVICE, OPTICAL SEMICONDUCTOR DEVICE, AND MANUFACTURING METHOD THEREOF

(75) Inventors: Shunsuke Kurachi, Yamanashi (JP); Tsutomu Komatani, Yamanashi (JP)

(73) Assignee: Eudyna Devices In., Yamanashi (JP)

( * ) Notice: Subject to any disclaimer, the term of this patent is extended or adjusted under 35 U.S.C. 154(b) by 224 days.

(21) Appl. No.: 11/391,200

(22) Filed: Mar. 29, 2006

(65) Prior Publication Data

US 2006/0220192 A1 Oct. 5, 2006

(30) Foreign Application Priority Data

Mar. 30, 2005 (JP) ............................. 2005-100248

(51) Int. Cl.
 *H01L 29/76* (2006.01)
 *H01L 29/94* (2006.01)
 *H01L 31/062* (2006.01)
 *H01L 31/113* (2006.01)
 *H01L 31/119* (2006.01)

(52) U.S. Cl. ...................... 257/406; 257/405; 438/50

(58) Field of Classification Search ............... 257/405, 257/406, 410, 411; 438/50, 51, 585, 591
See application file for complete search history.

(56) References Cited

U.S. PATENT DOCUMENTS

| 6,031,252 A * | 2/2000 | Miura et al. ................... 257/96 |
| 6,045,626 A * | 4/2000 | Yano et al. ................... 148/33.4 |
| 6,294,440 B1 * | 9/2001 | Tsuda et al. .................. 438/479 |
| 6,770,504 B2 * | 8/2004 | Horning et al. ............... 438/48 |
| 2006/0024512 A1 * | 2/2006 | Kishimoto et al. ........... 428/447 |

FOREIGN PATENT DOCUMENTS

JP 2003-113000 4/2003

* cited by examiner

*Primary Examiner*—Phuc T Dang
(74) *Attorney, Agent, or Firm*—Westerman, Hattori, Daniels & Adrian, LLP.

(57) ABSTRACT

A semiconductor substrate includes: a semiconductor crystal layer grown on one face of a substrate; and a stress relaxation layer, which is formed on the other face opposite to the one face and the side face of the substrate and applies stress to the substrate in the same direction as the direction of stress which the semiconductor crystal layer applies to the substrate. In this case, stress of the semiconductor crystal layer to the substrate is offset. Therefore, warp of the semiconductor substrate and generation of cracks are inhibited.

16 Claims, 10 Drawing Sheets

DICING BLADE

DICING BLADE

SEMICONDUCTOR SUBSTRATE, SUBSTRATE FOR SEMICONDUCTOR CRYSTAL GROWTH, SEMICONDUCTOR DEVICE, OPTICAL SEMICONDUCTOR DEVICE, AND MANUFACTURING METHOD THEREOF

BACKGROUND OF THE INVENTION

1. Field of the Invention

The present invention relates to a semiconductor substrate, a substrate for semiconductor crystal growth, a semiconductor device, an optical semiconductor device, and manufacturing methods thereof.

2. Description of the Related Art

A semiconductor device using a nitride semiconductor is used as a power device operating at a high frequency and high output. In the semiconductor device, a sapphire substrate or the like is used as a growth substrate of a semiconductor crystal layer. However, there is a large difference between the lattice constant and the thermal expansion coefficient of the growth substrate and the lattice constant and the thermal expansion coefficient of the semiconductor crystal layer. Thereby, there have been risks that, for example, the whole semiconductor device is warped, cracks are generated, leading to lowering of the yield ratio.

Therefore, a technique to provide a stress offsetting layer on the rear side of the growth substrate has been disclosed (for example, refer to Japanese Patent Application Publication No. 2003-113000). According to the technique, it is possible to inhibit warp of the growth substrate and generation of cracks by the stress offsetting layer.

However, the inventors of the present invention have found that it is not possible to effectively inhibit peeling at the interface between the growth substrate and the semiconductor crystal layer, or peeling at the interface between respective semiconductor layers in the growth substrate and the semiconductor crystal layer by the foregoing technique disclosed in Japanese Patent Application Publication No. 2003-113000.

SUMMARY OF THE INVENTION

It is an object of the present invention to provide a semiconductor substrate, a substrate for semiconductor crystal growth, a semiconductor device, an optical semiconductor device, and manufacturing methods thereof, which can effectively inhibit warp of the substrate and generation of cracks, and can prevent peeling at the interface between respective semiconductor layers.

According to an aspect of the present invention, there is provided a semiconductor substrate according to the present invention includes: a semiconductor crystal layer grown on one face of a substrate; and a stress relaxation layer, which is formed on the other face of the substrate opposite to the one face and is formed on the side face of the substrate continuously from the other face of the substrate, and gives stress to the substrate in the same direction as the direction of stress which the semiconductor crystal layer gives to the substrate.

According to another aspect of the present invention, there is provided a manufacturing method of a semiconductor substrate according to the present invention includes the steps of: growing a semiconductor crystal layer on one face of a substrate; and forming a stress relaxation layer, which gives stress to the substrate in the same direction as the direction of stress which the semiconductor crystal layer gives to the substrate on the other face of the substrate opposite to the one face and on the side face of the substrate continuously from the other face of the substrate.

According to still another aspect of the present invention, there is provided a substrate for semiconductor crystal growth according to the present invention includes: a stress relaxation layer that is formed on an other face opposite to one face of the substrate and is formed on a side face of the substrate continuously from the other face of the substrate, the stress relaxation layer applying stress to the substrate for a semiconductor crystal layer in the same direction as the direction of stress from the semiconductor crystal layer formed on the other one face of the substrate.

According to a further aspect of the present invention, there is provided a manufacturing method of a substrate for semiconductor crystal growth according to the present invention includes the step of: forming a stress relaxation layer that is formed on an other face opposite to one face of the substrate and is formed on a side face of the substrate continuously from the other face of the substrate, the stress relaxation layer applying stress to the substrate for a semiconductor crystal layer in the same direction as the direction of stress from the semiconductor crystal layer formed on the one face of the substrate.

According to a still further aspect of the present invention, there is provided a semiconductor device according to the present invention includes: a semiconductor crystal layer, which is provided on one face of a substrate and becomes an operating layer of a field effect transistor; and a stress relaxation layer, which is provided on the other face of the substrate opposite to one face divided into a chip and is provided on the side face of the substrate continuously from the other face of the substrate, and which gives stress to the substrate in the same direction as the direction of stress which the semiconductor crystal layer gives to the substrate.

According to another aspect of the present invention, there is provided a manufacturing method of a semiconductor device according to the present invention includes the step of: forming a stress relaxation layer, which applies stress to a substrate in the same direction as the direction of stress which a semiconductor crystal layer applies to the substrate, on the other face of the substrate opposite to one face thereof and on a region defining a side face when the substrate is divided into chips, the other face of the substrate being provided with the semiconductor crystal layer to become an operating layer of a field effect transistor.

According to another aspect of the present invention, there is provided an optical semiconductor device according to the present invention includes: a semiconductor crystal layer, which is provided on one face of a substrate and includes an active layer and cladding layers sandwiching the active layer in between; and a stress relaxation layer, which is provided on the other face of the substrate opposite to the one face divided into a chip and is provided on the side face of the substrate continuously from the other face of the substrate, and gives stress to the substrate in the same direction as the direction of stress which the semiconductor crystal layer gives to the substrate.

According to a further aspect of the present invention, there is provided a manufacturing method of an optical semiconductor device according to the present invention includes the step of: forming a stress relaxation layer, which applies stress to a substrate in the same direction as the direction of stress which a semiconductor crystal layer applies to the substrate, on the other face of the substrate and the other face of the semiconductor is provided with an active layer and cladding layers where the active layer is placed between the cladding layers in a vertical direction and on a region defining a side face when the substrate is divided into chips.

According to the present invention, the same stress as stress which the semiconductor crystal layer applies in the face direction of the substrate is given to the opposite face of the substrate. Therefore, stress of the semiconductor crystal layer to the substrate is offset. Thereby, warp of the semiconductor substrate according to the present invention and generation of cracks are inhibited.

Further, in the present invention, the stress relaxation layer giving such stress extends to the side face of the substrate in order to prevent the stress relaxation layer from being peeled from the substrate due to the stress. Thereby, the present invention resolves warp of the substrate effectively. Therefore, dimensional variation of exposure of the whole wafer when a device pattern is formed on the semiconductor wafer by lithography or the like is prevented from being generated. Thereby, a high detailed device pattern can be formed on the semiconductor wafer according to the present invention. Further, the yield ratio in manufacturing the semiconductor device by using the semiconductor wafer according to the present invention is significantly improved.

Further, when the present invention is applied to an FET, change of the electric characteristics inside the FET based on warp of the substrate, or change of the characteristics of the FET based thereon can be prevented. Further, when the present invention is applied to a VCSEL (Vertical Cavity Surface Emitting Laser), strain of the resonator based on warp can be prevented.

BRIEF DESCRIPTION OF THE DRAWINGS

Preferred embodiments of the present invention will be described in detail with reference to the following drawings, wherein.

DESCRIPTION OF THE PREFERRED EMBODIMENTS

A description will now be given, with reference to the accompanying drawings, of embodiments of the present invention.

First Embodiment

Figure 1:
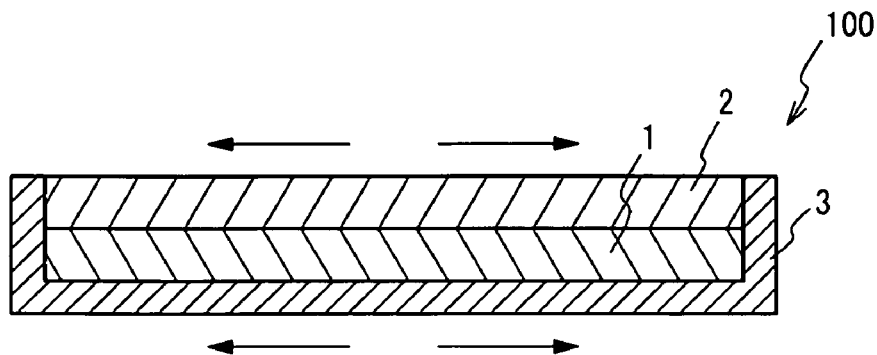
FIG. 1 is a typical cross section of a semiconductor wafer according to the present invention.
Figure 2:
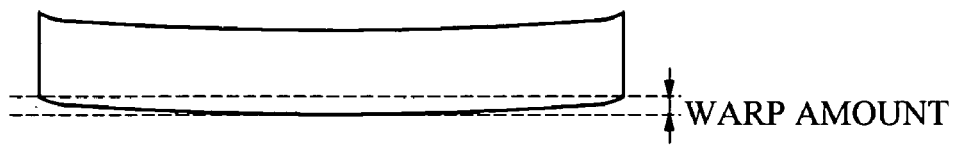
FIG. 2 is a drawing for explaining a warp amount of the semiconductor wafer.

FIG. 1 shows a typical cross section of a semiconductor substrate 100 according to a first embodiment. As shown in FIG. 1, the semiconductor substrate 100 includes a growth substrate 1, a semiconductor crystal layer 2, and a stress relaxation layer 3. The growth substrate 1 functions as a substrate for a semiconductor wafer, and may be a substrate such as GaN, SiC, or sapphire.

The semiconductor crystal layer 2 is formed on the growth substrate 1. The semiconductor crystal layer 2 is made of a GaN-based semiconductor and the like. When the semiconductor substrate 100 is used for a GaN-based HEMT, the semiconductor crystal layer 2 has a structure, in which a GaN-based semiconductor layer, a GaN layer, an AlGaN layer, and a GaN-based semiconductor layer are sequentially layered from the growth substrate 1 side.

The stress relaxation layer 3 is formed on the bottom face of the growth substrate 1, the side face of the growth substrate 1, and the side face of the semiconductor crystal layer 2. The stress relaxation layer 3 is preferably formed continuously from the bottom face of the growth substrate 1 to the side face of the growth substrate 1 and the side face of the semiconductor crystal layer 2. The stress relaxation layer 3 is formed from an insulating film such as SiN, a metal film such as WSi, TiW, and TiN, a semiconductor film such as GaN or the like.

The growth substrate 1 and the semiconductor crystal layer 2 are respectively formed from materials different from each other. Thereby, there is a difference between the lattice constant and the thermal expansion coefficient of the growth substrate 1 and the lattice constant and the thermal expansion coefficient of the semiconductor crystal layer 2. Further, even when the growth substrate 1 and the semiconductor crystal layer 2 are formed from the same material, a difference between the lattice constant and the thermal expansion coefficient of the growth substrate 1 and the lattice constant and the thermal expansion coefficient of the semiconductor crystal layer 2 is generated at the time of forming the semiconductor crystal layer 2 on the growth substrate 1. Therefore, the semiconductor crystal layer 2 has stress to the growth substrate 1 in the tensile direction or in the compressive direction. In particular, in the semiconductor substrate 100 used for a GaN-based HEMT, the semiconductor crystal layer 2 has stress to the growth substrate 1 in the tensile direction.

The stress relaxation layer 3 according to this embodiment has stress to the growth substrate 1 in the same direction as the direction of stress which the semiconductor crystal layer 2 has to the growth substrate 1. Thereby, the tensile stress or the compressive stress of the semiconductor crystal layer 2 to the growth substrate 1 is offset. Therefore, warp of the semiconductor substrate 100 and generation of cracks are inhibited. It is thus possible to eliminate dimensional variation of exposure of the whole wafer when a device pattern is formed on the semiconductor substrate 100 by lithography or the like. Consequently, a high detailed device pattern can be formed on the semiconductor substrate 100.

Further, in the semiconductor substrate 100 according to this embodiment, the stress relaxation layer 3 is formed to the side face of the growth substrate 1 and the side face of the semiconductor crystal layer 2. Therefore, stress of the semiconductor crystal layer 2 to the growth substrate 1 can be more effectively offset. Further, since the growth substrate 1 and the semiconductor crystal layer 2 are fixed by the stress relaxation layer 3, peeling at the interface between the growth substrate 1 and the semiconductor crystal layer 2 can be effectively prevented. Therefore, the yield ratio in manufacturing the semiconductor device by using the semiconductor substrate 100 is significantly improved.

Stress of the stress relaxation layer 3 is proportional to the film thickness of the stress relaxation layer 3. Therefore, it is possible to give a given stress to the growth substrate 1 by controlling the film thickness of the stress relaxation layer 3 as appropriate.

Further, a material making the stress relaxation layer 3 can be selected as appropriate according to the stress direction of the semiconductor crystal layer 2 to the growth substrate 1. Thereby, warp of the semiconductor substrate 100 and generation of cracks can be effectively inhibited.

Materials that may be used as the stress relaxation layer 3 and the film thicknesses thereof are hereinafter shown in Table 1. As shown in Table 1, as the stress relaxation layer 3, $SiO_2$, Au, WSi, SiON, SiN, TiW, NiCr, Ni, Ti and the like can be used. The respective materials apply stress to the growth substrate 1 in the tensile direction.

TABLE 1

| Formative film | Stress (Dyne/cm$^2$) | | Film thickness range (nm) | |
|---|---|---|---|---|
| | Value | Direction | MIN | MAX |
| SiO$_2$ | 5.00E+08 | Tensile | 1300 | 2500 |
| Au | 1.00E+09 | Tensile | 600 | 1200 |
| WSi | 1.00E+09 | Tensile | 600 | 1200 |
| SiON | 3.00E+09 | Tensile | 200 | 400 |
| SiN | 3.00E+09 | Tensile | 200 | 400 |
| TiW | 3.00E+09 | Tensile | 200 | 400 |
| NiCr | 5.00E+09 | Tensile | 100 | 250 |
| Ni | 1.00E+10 | Tensile | 60 | 120 |
| Ti | 2.00E+10 | Tensile | 30 | 60 |

Further, film thickness ranges of the stress relaxation layer 3 capable of allowing the warp amount of the semiconductor substrate 100 to be 5 μm or less are shown in Table 1. In this case, the growth substrate 1 is made of SiC, sapphire, GaN or the like. Further, the semiconductor crystal layer 2 is made of Al, Ga, In, N and the like. Here, the warp amount means a value obtained by subtracting the film thickness at the central section of the semiconductor wafer from the height of the semiconductor wafer in a state that the convex surface is upward.

Figure 3:
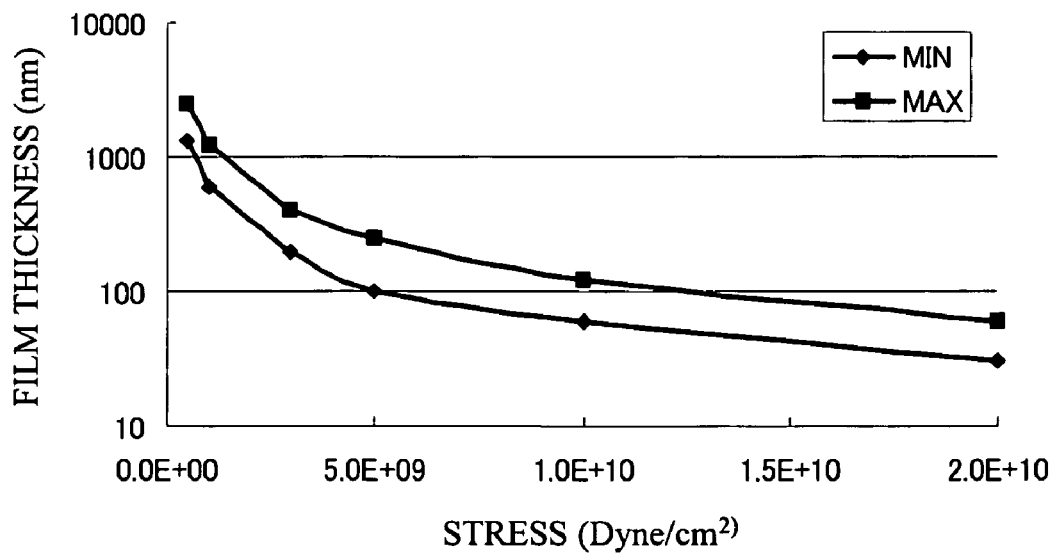
FIG. 3 is a figure showing a relation between stress of a stress relaxation layer and film thicknesses.

FIG. 3 shows a relation between the stress and the film thickness of the stress relaxation layer 3 in the case that the warp amount of the semiconductor substrate 100 is limited to 5 μm or less. The vertical axis of FIG. 3 represents the film thickness of the stress relaxation layer 3, and the horizontal axis of FIG. 3 represents stress of the stress relaxation layer 3.

As shown in FIG. 3, as stress of the stress relaxation layer 3 is increased, the film thickness of the stress relaxation layer 3 is decreased. As above, the material making the stress relaxation layer 3, the film thickness thereof and the like can be selected as appropriate according to the material, the diameter, the film thickness and the like of the growth substrate 1 and the semiconductor crystal layer 2.

According to this embodiment, the warp amount of the semiconductor substrate 100 can be effectively limited by the stress relaxation layer 3 formed to the side face of the growth substrate 1 and the side face of the semiconductor crystal layer 2. Thereby, for example, strain of the pattern in the lithography step performed for forming the electrode can be inhibited. Therefore, high precision patterning is enabled.

In this embodiment, the stress relaxation layer 3 is formed wholly on the side face of the growth substrate 1 and wholly on the side face of the semiconductor crystal layer 2. However, even when the stress relaxation layer 3 is formed only on the side face of the growth substrate 1, or on part of the side face of the growth substrate 1 and the semiconductor crystal layer 2, the warp amount of the semiconductor substrate 100 can be effectively decreased. Thereby, peeling of the semiconductor crystal layer 2 can be prevented.

Figure 4A:
FIGS. 4a, 4b, and 4c show a process flow for explaining a manufacturing method of a semiconductor substrate.
Figure 4B:
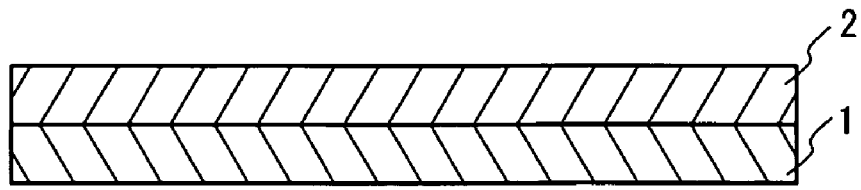
Figure 4C:
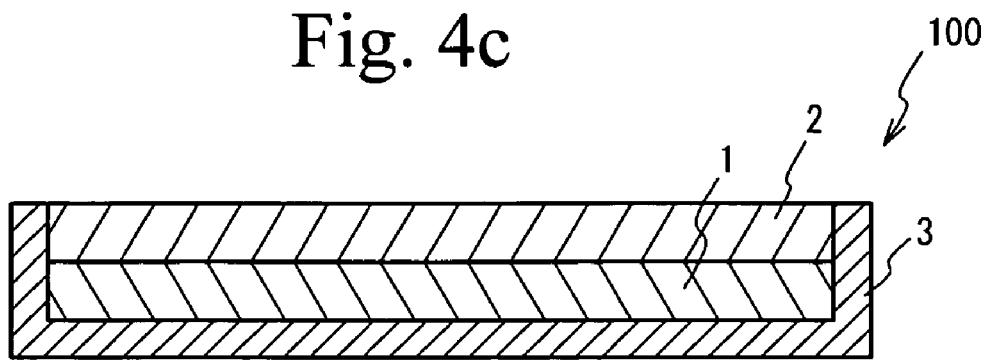

Next, descriptions will be given of a manufacturing method of the semiconductor substrate 100 of FIG. 1. FIGS. 4a, 4b, and 4c show a process flow for explaining the manufacturing method of the semiconductor substrate 100. First, as shown in FIG. 4a, the growth substrate 1 is prepared.

Next, as shown in FIG. 4b, the semiconductor crystal layer 2 is epitaxial-grown on the growth substrate 1 by MOCVD method. When the semiconductor substrate 100 is used for a GaN-based HEMT, the semiconductor crystal layer 2 is formed by sequentially layering a GaN-based semiconductor layer, a GaN layer, an AlGaN layer, and a GaN-based semiconductor layer from the growth substrate 1 side.

Next, as shown in FIG. 4c, the stress relaxation layer 3 covering the bottom face of the growth substrate 1, the side face of the growth substrate 1, and the side face of the semiconductor crystal layer 2 is formed. The stress relaxation layer 3 is made of SiN, a metal, GaN or the like. When SiN is used as the stress relaxation layer 3, the stress relaxation layer 3 can be formed by sputtering or CVD method.

When a metal is used as the stress relaxation layer 3, the stress relaxation layer 3 can be formed by sputtering or vacuum vapor deposition method. When GaN is used as the stress relaxation layer 3, the stress relaxation layer 3 can be formed by MOVPE (Metal-Organic Vapor Phase Epitaxy). When other material is used as the stress relaxation layer 3, the stress relaxation layer 3 can be formed by a method according to such other material. By the foregoing steps, the semiconductor substrate 100 is completed.

Second Embodiment

In the first embodiment, the stress relaxation layer 3 is provided after the semiconductor crystal layer 2 is formed on the growth substrate 1. Meanwhile, it is also possible that after stress is previously given to the growth substrate 1, the semiconductor crystal layer 2 is grown so that the warp amount is reduced totally. That is, the present invention can work on a substrate for semiconductor crystal growth to which an opposite stress is previously given before the semiconductor crystal layer 2 is grown.

Figure 5:
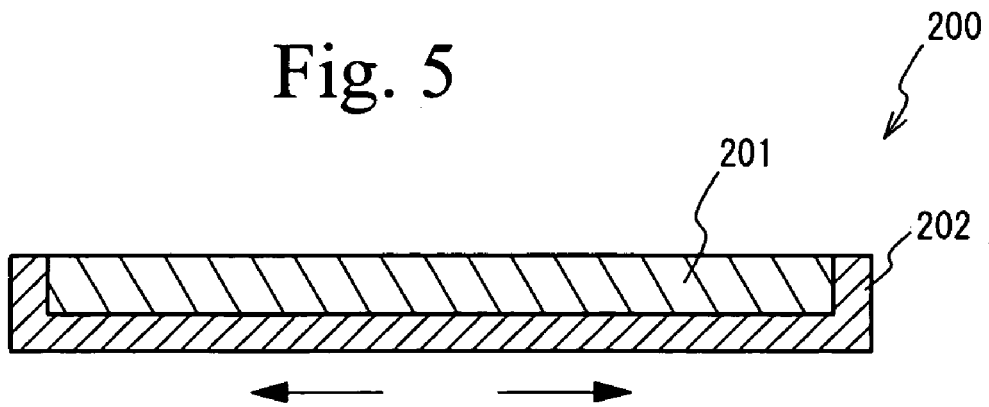
FIG. 5 is a typical cross section of a substrate for semiconductor crystal growth according to a second embodiment.

FIG. 5 is a typical cross section of a substrate for semiconductor crystal growth 200 according to a second embodiment. As shown in FIG. 5, the substrate for semiconductor crystal growth 200 includes a growth substrate 201 and a stress relaxation layer 202. As the growth substrate 201, a growth substrate similar to the growth substrate 1 of FIG. 1 can be used. The stress relaxation layer 202 is formed on the bottom face and the side face of the growth substrate 201. As the stress relaxation layer 202, a stress relaxation layer similar to the stress relaxation layer 3 of FIG. 1 can be used. The stress relaxation layer 202 is preferably formed continuously from the bottom face of the growth substrate 201 to the side face of the growth substrate 201.

The stress relaxation layer 202 according to this embodiment has stress to the growth substrate 201 in the same direction as the direction of stress which a semiconductor crystal layer to be formed on the growth substrate 201 has to the growth substrate 201. Thereby, the tensile stress or the compressive stress of the semiconductor crystal layer to the growth substrate 201 is offset. Therefore, warp of the substrate for semiconductor crystal growth 200 and generation of cracks after forming the semiconductor crystal layer are inhibited. In result, peeling of the semiconductor crystal layer is also prevented.

Figure 6A:
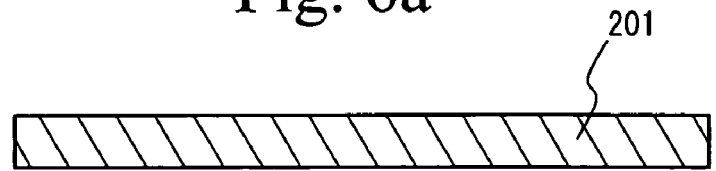
FIGS. 6a and 6b show a process flow for explaining a manufacturing method of the substrate for semiconductor crystal growth.
Figure 6B:
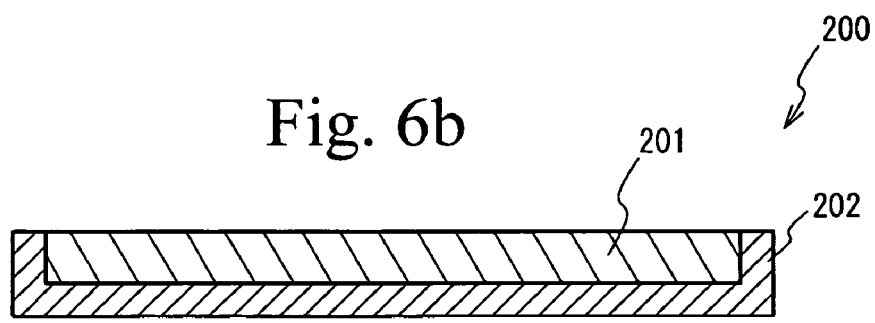

Next, descriptions will be given of a manufacturing method of the substrate for semiconductor crystal growth 200. FIGS. 6a and 6b show a process flow for explaining the manufacturing method of the substrate for semiconductor crystal growth 200. First, as shown in FIG. 6a, the growth substrate 1 is prepared.

Next, as shown in FIG. 6b, the stress relaxation layer 202 covering the bottom face and the side face of the growth substrate 1 is formed. The stress relaxation layer 202 is made of SiN, a metal, GaN or the like. When SiN is used as the stress relaxation layer 202, the stress relaxation layer 202 can be formed by sputtering or CVD method.

When a metal is used as the stress relaxation layer 202, the stress relaxation layer 202 can be formed by sputtering or vacuum vapor deposition method. When GaN is used as the stress relaxation layer 202, the stress relaxation layer 202 can be formed by MOVPE When other material is used as the stress relaxation layer 202, the stress relaxation layer 202 can be formed by a method according to such other material. By the foregoing steps, the substrate for semiconductor crystal growth 200 is completed.

Third Embodiment

Effects of the stress relaxation layer as described in the first and the second embodiments are not limited to the lithography step in the manufacturing steps of semiconductor devices. For example, the stress relaxation layer also contributes to relaxation of warp generated after the wafer is divided into chip-like semiconductor devices by dicing or the like. In result, characteristics deterioration of the semiconductor device can be prevented. Descriptions will be hereinafter given of a semiconductor device provided with a stress relaxation layer. As an example of semiconductor devices, a GaN-based HEMT will be described.

Figure 7:
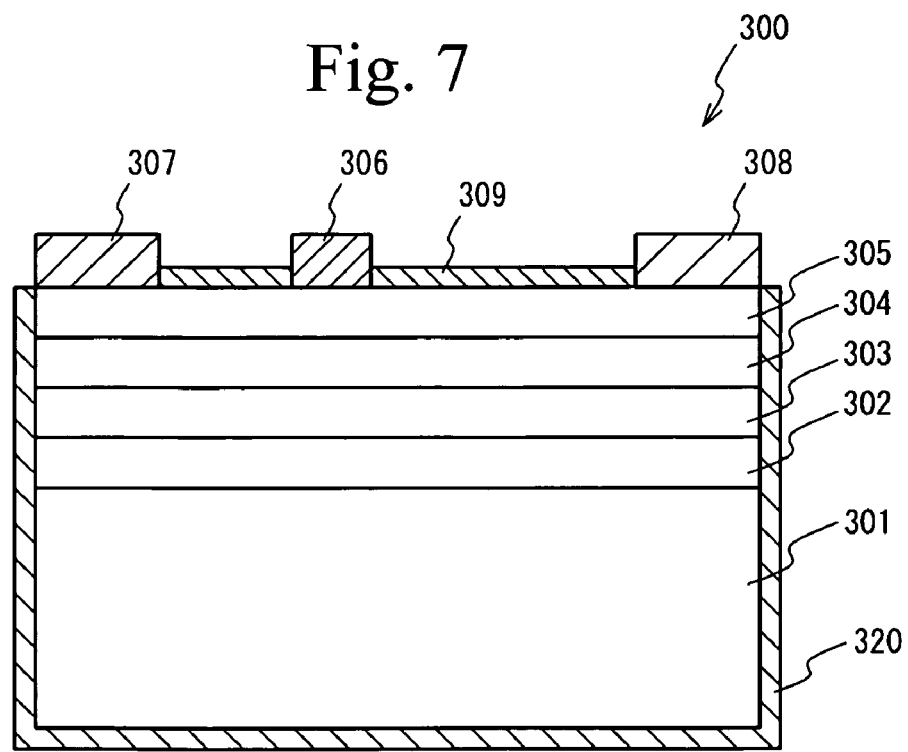
FIG. 7 is a typical cross section of a semiconductor device according to a third embodiment (GaN-based HEMT)

FIG. 7 is a typical cross section of a semiconductor device 300 according to a third embodiment (GaN-based HEMT). As shown in FIG. 7, in the semiconductor device 300, a buffer layer 302, a channel layer 303, an electron supply layer 304, and a cap layer 305 are sequentially formed over a substrate 301. For example, the substrate 301 is made of SiC, the buffer layer 302 is made of AlN, the channel layer 303 is made of GaN, the electron supply layer 304 is made of AlGaN, and the cap layer 305 is made of GaN. The buffer layer 302, the channel layer 303, the electron supply layer 304, and the cap layer 305 are hereinafter referred to as a semiconductor crystal layer 310.

A gate electrode 306 is formed on the cap layer 305. A source electrode 307 and a drain electrode 308 are formed on the cap layer 305 so that the source electrode 307 and the drain electrode 308 sandwich the gate electrode 306 in between. Further, on the cap layer 305, a surface protective film 309 is formed between the gate electrode 306 and the source electrode 307, and between the gate electrode 306 and the drain electrode 308. The surface protective film 309 is made of, for example, SiN.

A stress relaxation layer 320 is formed on the bottom face of the substrate 301 and the side face of the substrate 301, the buffer layer 302, the channel layer 303, the electron supply layer 304, and the cap layer 305. The stress relaxation layer 320 is preferably formed continuously from the bottom face of the substrate 301 to the side face of the substrate 301, the buffer layer 302, the channel layer 303, the electron supply layer 304, and the cap layer 305. The stress relaxation layer 320 is made of an insulating film such as SiN, a metal film such as WSi, TiW, and TiN, a semiconductor film such as GaN or the like.

The stress relaxation layer 320 according to this embodiment has stress to the substrate 301 in the same direction as the direction of stress which the semiconductor crystal layer 310 has to the substrate 301. Thereby, the tensile stress or the compressive stress of the semiconductor crystal layer 310 to the substrate 301 is offset. Therefore, warp of the semiconductor device 300 and generation of cracks are inhibited. Further, when warp of the semiconductor device 300 is inhibited, change of electron state of the semiconductor crystal layer 310 can be inhibited. Thereby, the characteristics of the semiconductor device 300 are improved. In result, the semiconductor device 300 realizes desired characteristics.

Further, in the semiconductor device 300 according to this embodiment, the stress relaxation layer 320 is formed to the side face of the substrate 301 and the side face of the semiconductor crystal layer 310. Therefore, stress of the semiconductor crystal layer 310 to the substrate 301 can be more effectively offset. Further, since the substrate 301 and the semiconductor crystal layer 310 are fixed by the stress relaxation layer 320, peeling at the interface between the substrate 301 and the semiconductor crystal layer 310 can be effectively prevented.

In this embodiment, the stress relaxation layer 320 is formed wholly on the side face of the substrate 301 and wholly on the side face of the semiconductor crystal layer 310. However, even when the stress relaxation layer 320 is formed only on part of the side face of the substrate 301, the warp amount of the semiconductor substrate 300 can be effectively decreased. Thereby, peeling of the semiconductor crystal layer 310 can be prevented.

Figure 8:
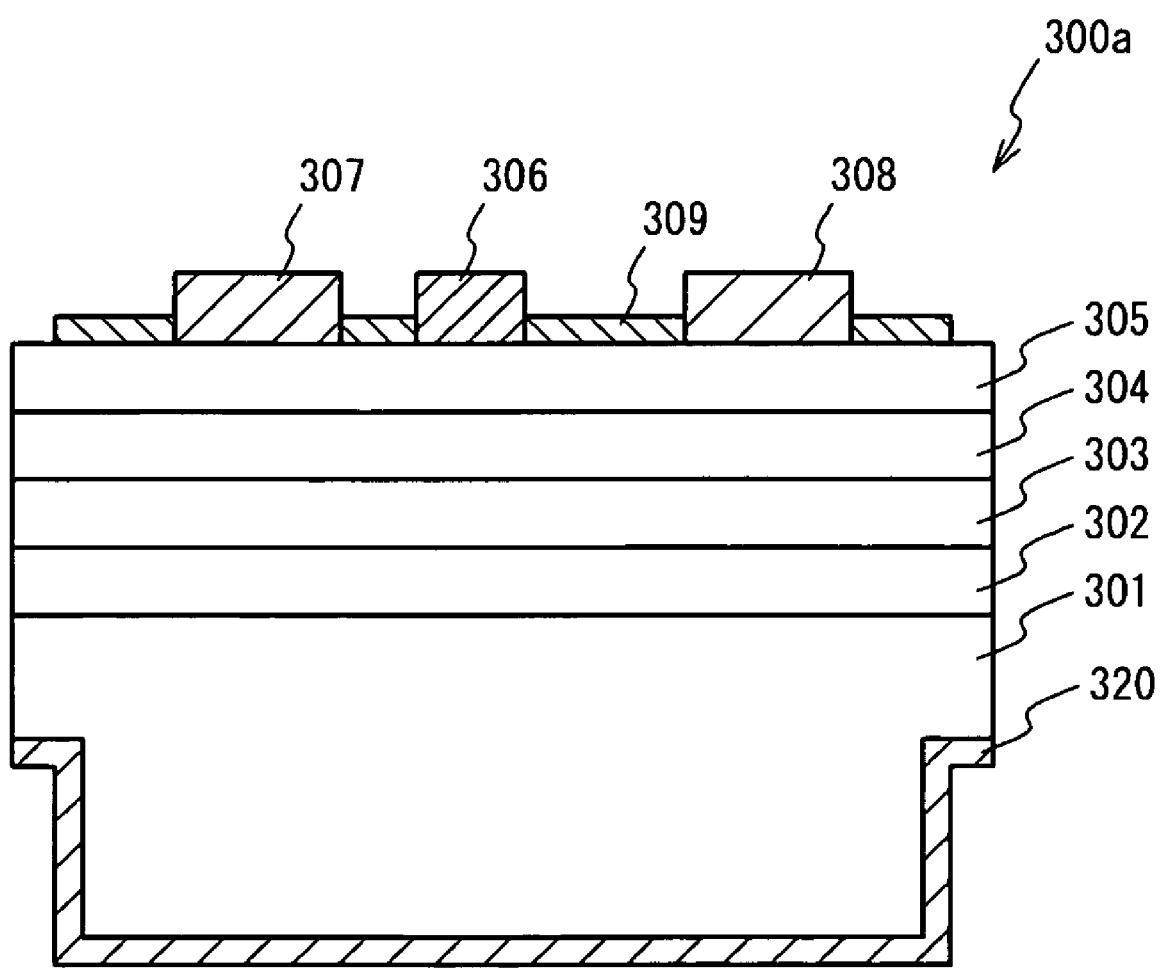
FIG. 8 is a typical cross section of other example of the semiconductor device according to this embodiment (GaN-based HEMT)

FIG. 8 is a typical cross section of a semiconductor device 300a as other example of the semiconductor device according to this embodiment (GaN-based HEMT). The semiconductor device 300a is different from the semiconductor device 300 of FIG. 7 in respect that the stress relaxation layer 320 is formed continuously on the bottom face of the substrate 301 and part of the side face of the substrate 301.

In this case, the stress relaxation layer 320 also has stress to the substrate 301 in the same direction as the direction of stress which the semiconductor crystal layer 310 has to the substrate 301. Thereby, the tensile stress or the compressive stress of the semiconductor crystal layer 310 to the substrate 301 is offset. Therefore, warp of the semiconductor device 300a and generation of cracks are inhibited. Though descriptions have been given of the GaN-based HEMT as an example of the semiconductor device according to this embodiment, the present invention can be applied to a semiconductor device, in which a gate electrode, a source electrode, and a drain electrode are provided on the semiconductor crystal layer. For example, the present invention can be applied to an FET.

Figure 9A:
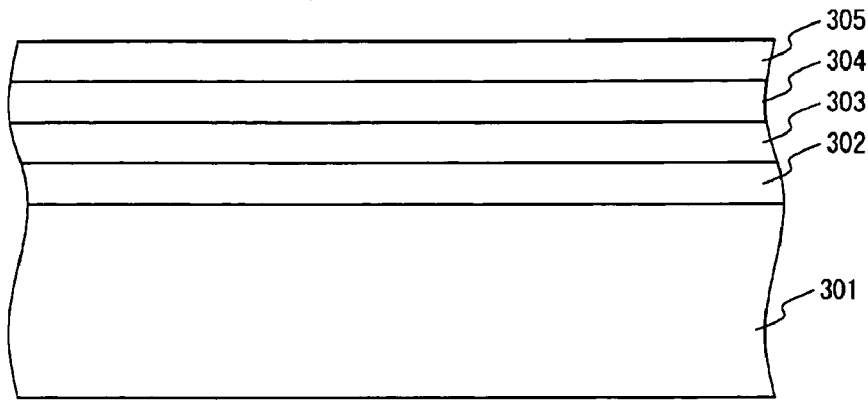
FIGS. 9a, 9b, and 9c show a process flow for explaining a manufacturing method of the semiconductor device.

Subsequently, descriptions will be given of a manufacturing method of the semiconductor device 300a. FIGS. 9a, 9b, 9c, 10a, and 10b show a process flow for explaining the manufacturing method of the semiconductor device 300a. First, as shown in FIG. 9a, the buffer layer 302, the channel layer 303, the electron supply layer 304, and the cap layer 305 are sequentially formed over the substrate 301 by CVD method or the like.

Figure 9B:
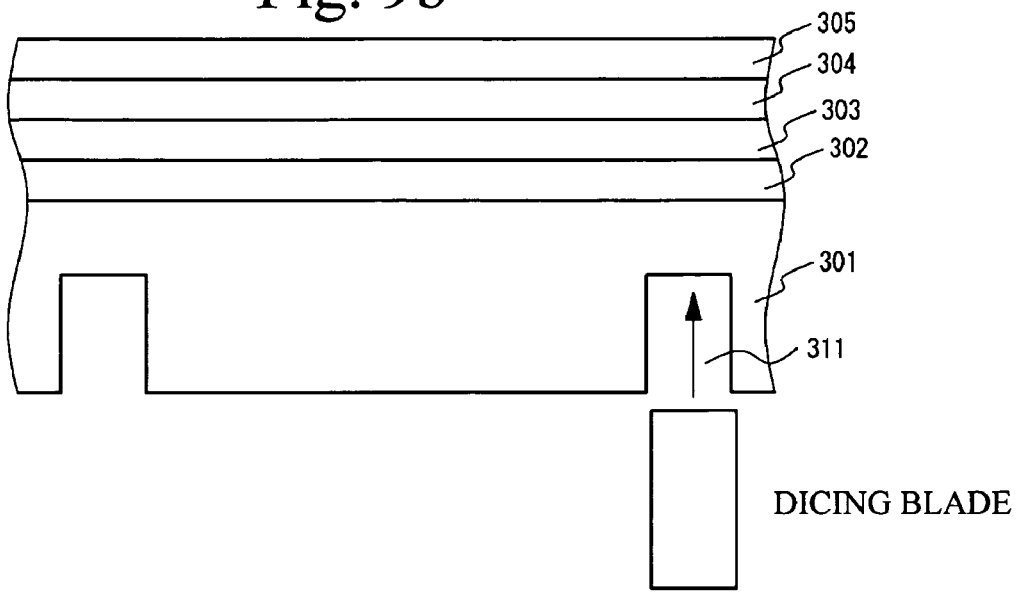
Figure 9C:
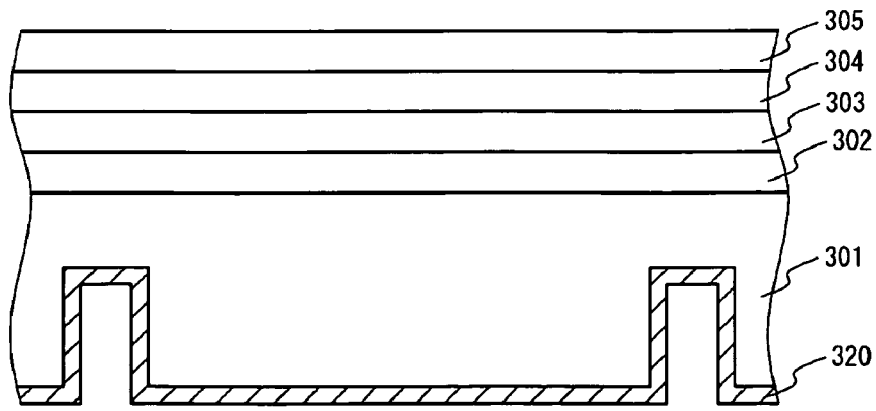

Next, as shown in FIG. 9b, a plurality of grooves 311 are formed on the bottom face of the substrate 301. The depth of the plurality of grooves 311 is not particularly limited as long as a notch section does not reach the buffer layer 302. The groove 311 can be formed by a dicing blade or can be formed by etching utilizing a mask. Next, as shown in FIG. 9c, the stress relaxation layer 320 is formed wholly on the bottom face of the substrate 301 by sputtering, CVD method or the like. Thereby, the stress relaxation layer 320 is formed on the plurality of grooves 311 as well.

Figure 10A:
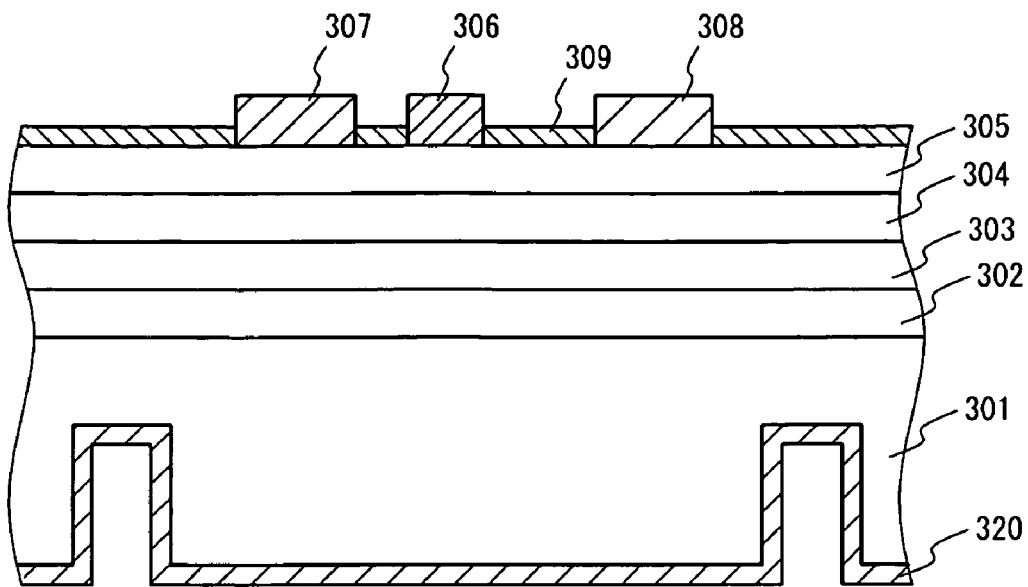
FIGS. 10a and 10b show a process flow for explaining the manufacturing method of the semiconductor device.

Next, as shown in FIG. 10a, the surface protective film 309 is formed on the cap layer 305, apertures are formed through the surface protective film 309, and the gate electrode 306, the source electrode 307, and the drain electrode 308 are formed in the apertures by CVD or the like. In this case, the apertures through the surface protective film 309 are formed so that one gate electrode 306, one source electrode 307, and one drain electrode 308 are formed on the cap layer 305 located between the adjacent grooves 311.

Figure 10B:
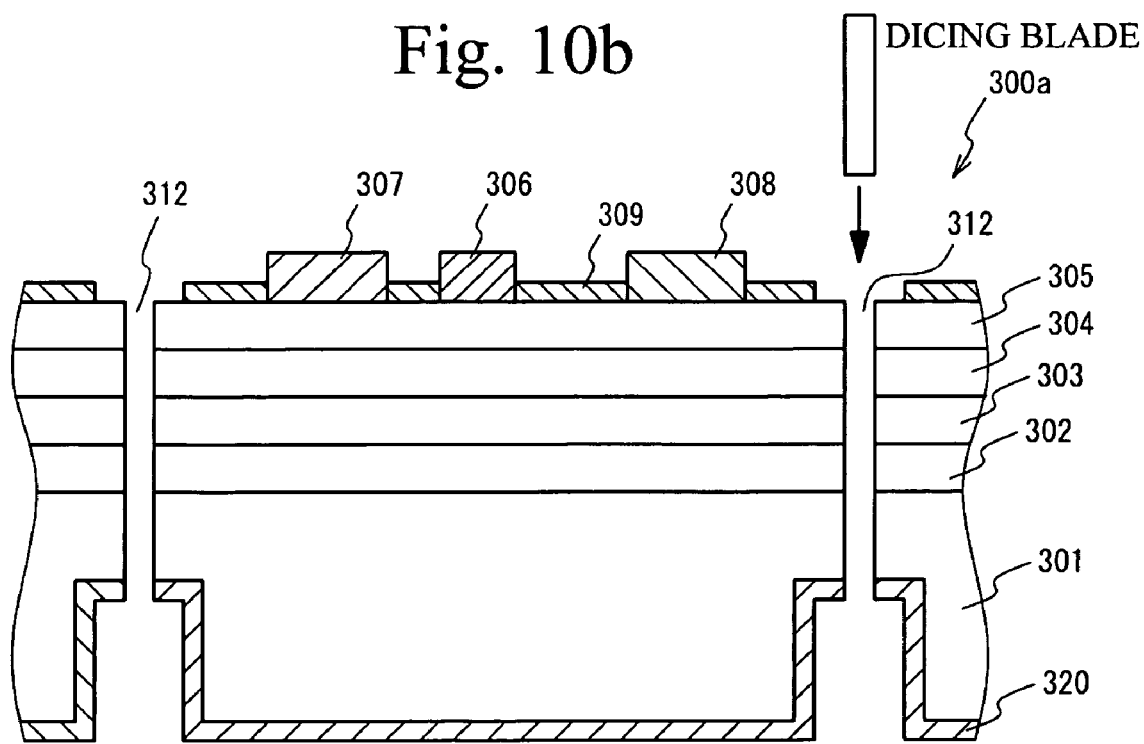

Next, as shown in FIG. 10b, an aperture 312 to become a dicing line is formed through the surface protective film 309 at the section above each groove 311. Subsequently, dicing is performed from each aperture 312 to each grove 311 by a dicing blade. By the foregoing steps, the semiconductor device 300a is formed.

According to the foregoing manufacturing method, the stress relaxation layer 320 can be formed on the side face of the semiconductor device 300a before the wafer is divided into chips as the semiconductor device 300a. Therefore, compared to a manufacturing method, in which a stress relaxation layer is provided after the wafer is divided into chips, the number of manufacturing steps of the semiconductor device is decreased. Further, effect of the present invention can be obtained in the semiconductor device 300a as well.

Forth Embodiment

Figure 11:
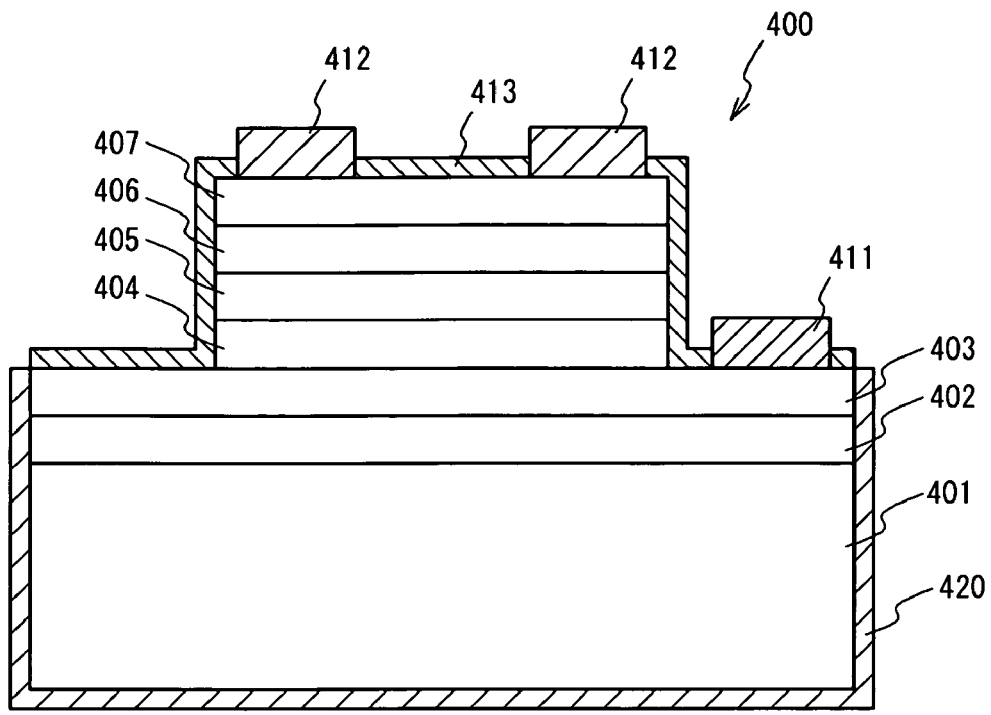
FIG. 11 is a typical cross section of an optical semiconductor device according to a fourth embodiment (GaN-based VCSEL)

Next, descriptions will be given of a GaN-based VCSEL as an example of an optical semiconductor device. FIG. 11 is a typical cross section of an optical semiconductor device 400 according to a fourth embodiment (GaN-based VCSEL). As shown in FIG. 11, in the optical semiconductor device 400, a buffer layer 402 and an n-type contact layer 403 are sequentially formed over a substrate 401. Further, an n-type cladding layer 404, a quantum well active layer 405, a p-type cladding layer 406, and a p-type contact layer 407 are sequentially formed on the central section of the n-type contact layer 403.

For example, the substrate 401 is made of SiC, the buffer layer 402 is made of AlN, the n-type contact layer 403 is made of n-type GaN, the n-type cladding layer 404 is made of n-type AlGaN, the quantum well active layer 405 is made of InGaN/GaN, the p-type cladding layer 406 is made of p-type AlGaN, and the p-type contact layer 407 is made of p-type GaN. The buffer layer 402, the n-type contact layer 403, the n-type cladding layer 404, the quantum well active layer 405, the p-type cladding layer 406, and the p-type contact layer 407 are hereinafter referred to as a semiconductor crystal layer 410.

An n-side electrode 411 is formed outside the n-type cladding layer 404 on the n-type contact layer 403. A ring-shaped p-side electrode 412 is formed on the p-type contact layer 407. Further, a surface protective film 413 is formed so that the surface protective film 413 covers the n-type cladding layer 404, the quantum well active layer 405, the p-type cladding layer 406, and the p-type contact layer 407. The surface protective film 413 is made of, for example, SiN.

A stress relaxation layer 420 is formed on the bottom face of the substrate 401 and the side face of the substrate 401, the buffer layer 402, and the n-type contact layer 403. The stress relaxation layer 420 is preferably formed continuously from the bottom face of the substrate 401 to the side face of the substrate 401, the buffer layer 402, and the n-type contact layer 403. The stress relaxation layer 420 is formed from an insulating film such as SiN, a metal film such as WSi, TiW, and TiN, a semiconductor film such as GaN or the like.

The stress relaxation layer 420 according to this embodiment has stress to the substrate 401 in the same direction as the direction of stress which the semiconductor crystal layer 410 has to the growth substrate 401. Thereby, the tensile stress or the compressive stress of the semiconductor crystal layer 410 to the growth substrate 401 is offset. Therefore, warp of the optical semiconductor device 400 and generation of cracks are inhibited.

Such an optical semiconductor device has resonator ends in the thickness direction of the semiconductor crystal layer. Needless to say, since the semiconductor crystal layer is difficult to have a large thickness, there is a tendency that a short resonator is formed. In such a resonator, the form error tolerable for the resonator is significantly small. Therefore, when warp of the semiconductor crystal layer is large, it is difficult to realize desired characteristics. In the optical semiconductor device 400 according to this embodiment, warp is inhibited. Therefore, the optical semiconductor device 400 has a high precision as a resonator. In result, the optical semiconductor device 400 has favorable characteristics.

Further, in the optical semiconductor device 400 according to this embodiment, the stress relaxation layer 420 is formed on the bottom face of the substrate 401 and the side face of the substrate 401, the buffer layer 402, and the n-type contact layer 403. Therefore, stress given from the semiconductor crystal layer 410 side to the substrate 401 is more effectively offset. Further, since the substrate 401, the buffer layer 402, and the n-type contact layer 403 are fixed by the stress relaxation layer 420, peeling at the interface between the substrate 401 and the buffer layer 402, and the interface between the buffer layer 402 and the n-type contact layer 403 can be effectively prevented.

In this embodiment, the stress relaxation layer 420 is formed on the side face of the substrate 401, the buffer layer 402, and the n-type contact layer 403. However, even when the stress relaxation layer 420 is formed only on part of the side face of the substrate 401, the warp amount of the semiconductor device 400 can be effectively decreased. Thereby, peeling of the semiconductor crystal layer 410 can be prevented.

Figure 12:
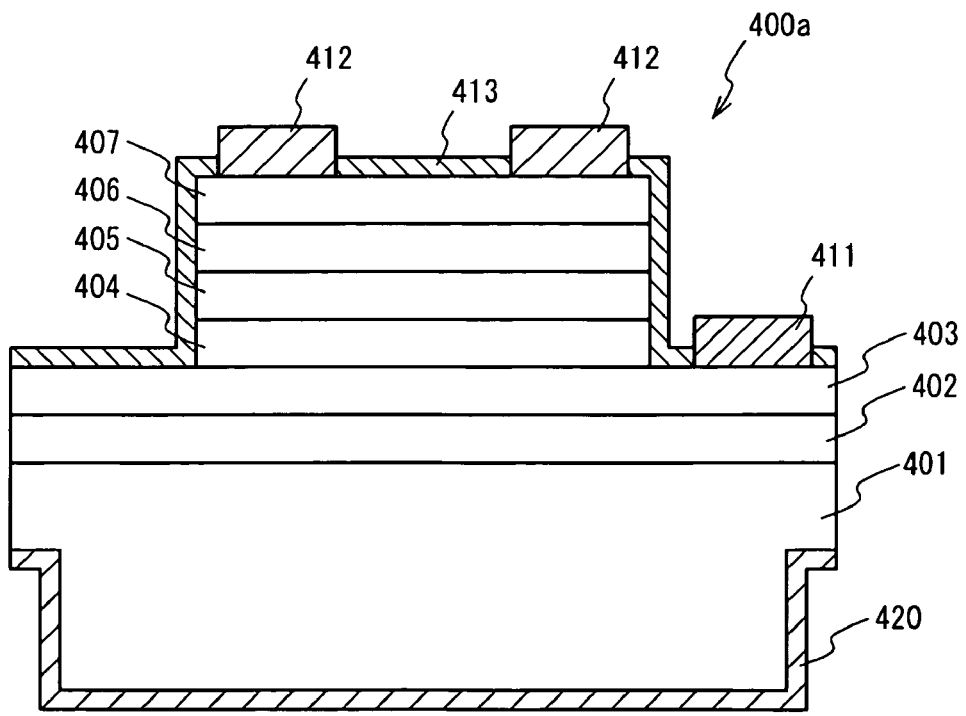
FIG. 12 is a typical cross section of other example of the optical semiconductor device according to this embodiment (GaN-based VCSEL)

FIG. 12 is a typical cross section of an optical semiconductor device 400a as other example of the optical semiconductor device according to this embodiment (GaN-based VCSEL). The optical semiconductor device 400a is different from the optical semiconductor device 400 of FIG. 11 in respect that the stress relaxation layer 420 is formed continuously on the bottom face of the substrate 401 and part of the side face of the substrate 401.

In this case, the stress relaxation layer 420 also has stress to the substrate 401 in the same direction as the direction of stress which the semiconductor crystal layer 410 also has to the substrate 401. Thereby, the tensile stress or the compressive stress of the semiconductor crystal layer 410 to the substrate 401 is offset. Therefore, warp of the optical semiconductor device 400a and generation of cracks are inhibited.

Figure 13A:
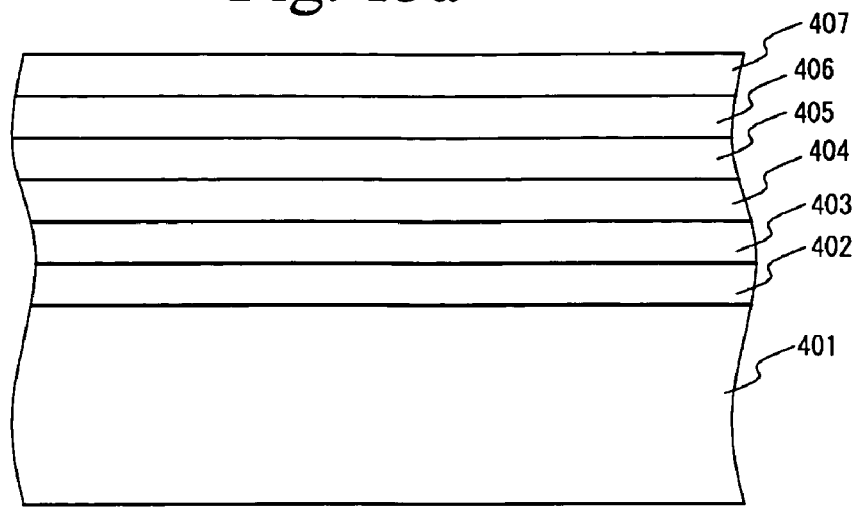
FIGS. 13a, 13b, and 13c show a process flow for explaining a manufacturing method of the optical semiconductor device.

Subsequently, descriptions will be given of a manufacturing method of the optical semiconductor device 400a. FIGS. 13a, 13b, 13c, 14a, 14b, 14c, and 15 show a process flow for explaining the manufacturing method of the optical semiconductor device 400a. First, as shown in FIG. 13a, the buffer layer 402, the n-type contact layer 403, the n-type cladding layer 404, the quantum well active layer 405, the p-type cladding layer 406, and the p-type contact layer 407 are sequentially formed over the substrate 401 by CVD method or the like.

Figure 13B:
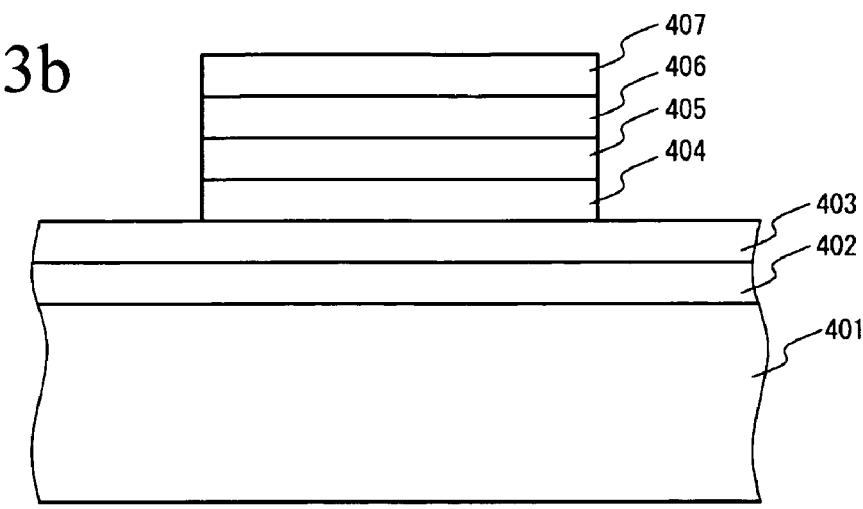
Figure 13C:
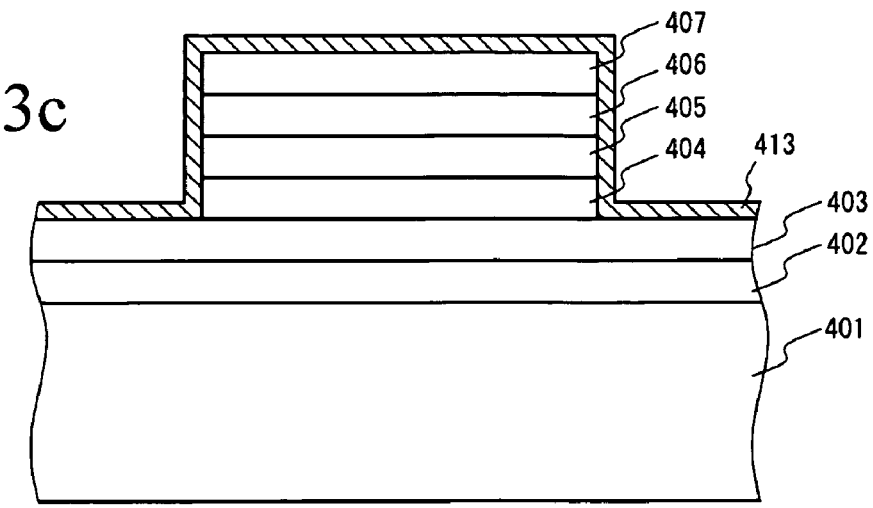

Next, as shown in FIG. 13b, the n-type cladding layer 404, the quantum well active layer 405, the p-type cladding layer 406, and the p-type contact layer 407 are selectively removed to expose the n-type contact layer 403. Next, as shown in FIG. 13c, the surface protective film 413 is formed so that the surface protective film 413 covers the n-type contact layer 403, the n-type cladding layer 404, the quantum well active layer 405, the p-type cladding layer 406, and the p-type contact layer 407.

Figure 14A:
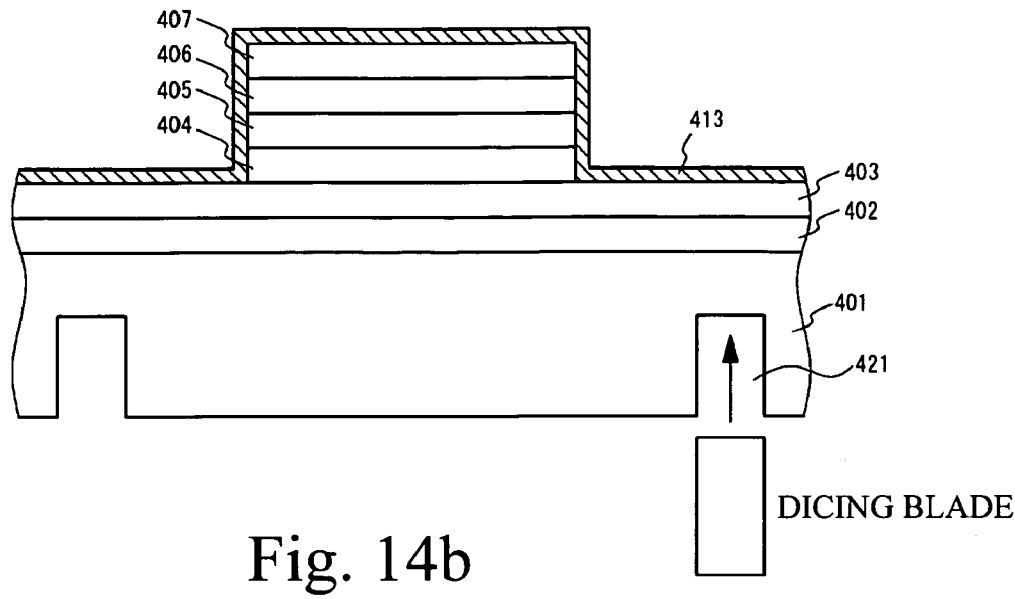
FIGS. 14a, 14b, and 14c show a process flow for explaining the manufacturing method of the optical semiconductor device.

Next, as shown in FIG. 14a, a plurality of grooves 421 are formed on the bottom face of the substrate 401. The grooves 421 are formed so that the grooves 421 sandwich the upper n-type cladding layer 404, the upper quantum well active layer 405, the upper p-type cladding layer 406, and the upper p-type contact layer 407 in between. The depth of the groove 421 is not particularly limited as long as a notch section does not reach the buffer layer 402. The groove 421 can be formed by a dicing blade or can be formed by etching utilizing a mask.

Figure 14B:
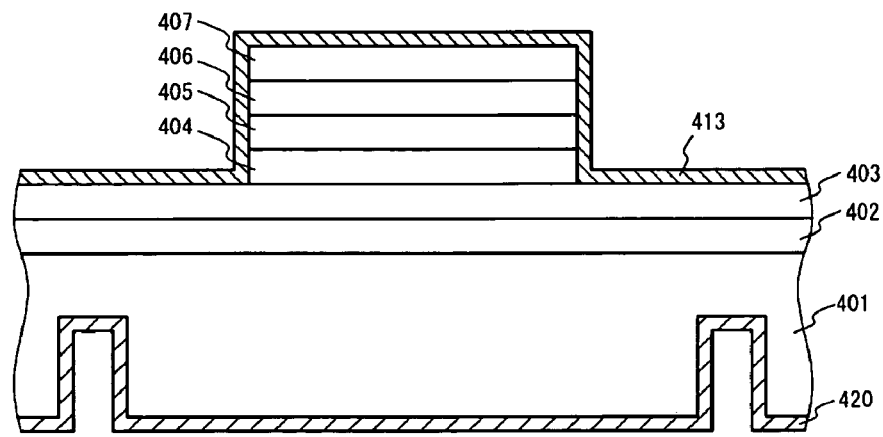
Figure 14C:
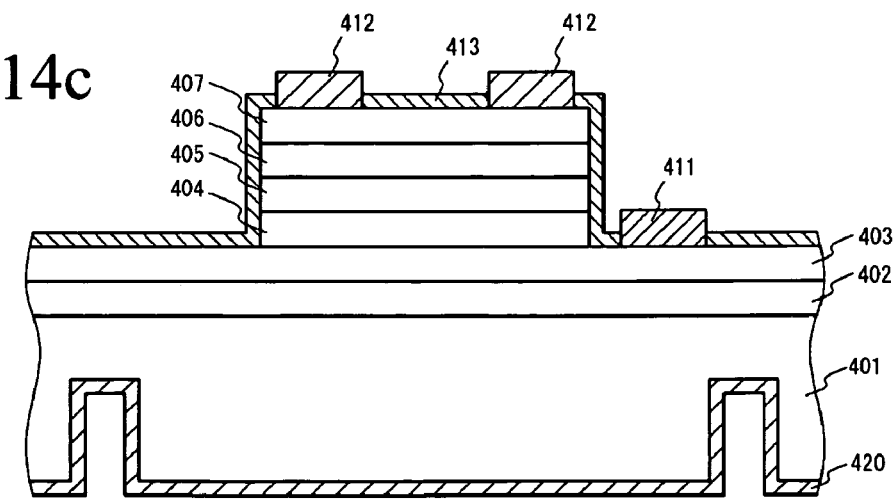

Next, as shown in FIG. 14b, the stress relaxation layer 420 is formed wholly on the bottom face of the substrate 401 by sputtering, CVD method or the like. Thereby, the stress relaxation layer 420 is formed on the plurality of grooves 421 as well. Next, as shown in FIG. 14c, apertures are formed through the surface protective film 413, and the n-side electrode 411 and the p-side electrode 412 are formed in the apertures by CVD method or the like. The p-side electrode 412 is a ring electrode surrounding the optical output window.

Figure 15:
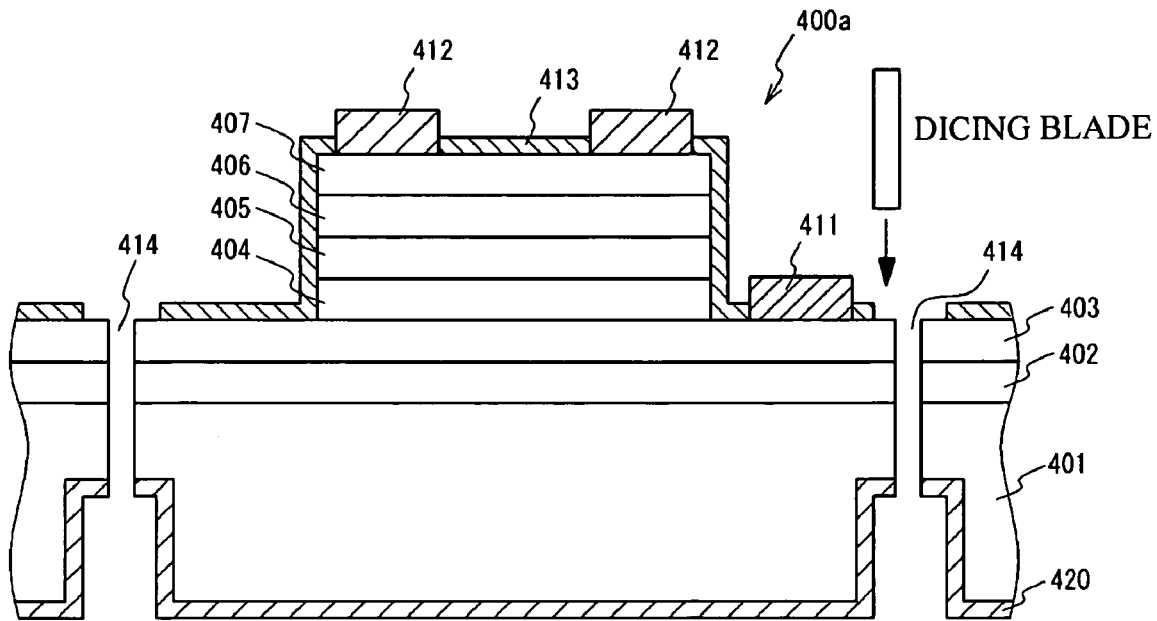
FIG. 15 shows a process flow for explaining the manufacturing method of the optical semiconductor device.

Next, as shown in FIG. 15, an aperture 414 to become a dicing line is formed through the surface protective film 413 at the section above each groove 421. Subsequently, dicing is performed from each aperture 414 to each grove 421 by a dicing blade. By the foregoing steps, the optical semiconductor device 400a is formed.

According to the foregoing manufacturing method, the stress relaxation layer 420 can be formed on the side face of the optical semiconductor device 400a before the wafer is divided into chips as the optical semiconductor device 400a. Therefore, compared to a manufacturing method, in which a stress relaxation layer is provided after the wafer is divided into chips, the number of manufacturing steps of the optical semiconductor device is decreased. Further, effect of the present invention can be obtained in the optical semiconductor device 400a as well.

EXAMPLES

Comparative Example 1

Figure 16:
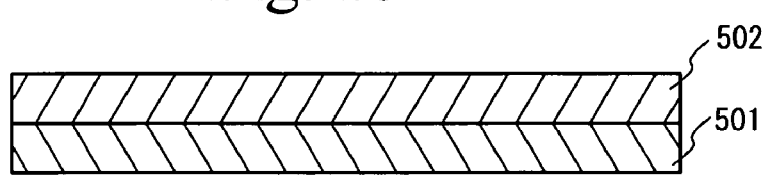
FIG. 16 is a typical cross section of a traditional semiconductor substrate.

As Comparative example 1, a traditional semiconductor substrate 500 was fabricated. FIG. 16 is a typical cross section of the traditional semiconductor substrate 500. As shown in FIG. 16, a semiconductor crystal layer 502 made of Al, Ga, In, and N was epitaxial-grown on a growth substrate 501 made of SiC by MOCVD method.

Example 1

As Example 1, the semiconductor substrate 100 of FIG. 1 was fabricated according to the foregoing embodiment. SiC was used as the growth substrate 1, a crystal layer made of Al, Ga, In, and N was used as the semiconductor crystal layer 2, and $SiO_2$ was used as the stress relaxation layer 3. The semiconductor crystal layer 2 was epitaxial-grown on the growth substrate 1 by MOCVD method. The stress relaxation layer 3 was formed on the bottom face of the growth substrate 1, the side face of the growth substrate 1, and the side face of the semiconductor crystal layer 2 by sputtering.

(Analysis)

The warp amounts of the semiconductor substrate 500 according to Comparative example 1 and the semiconductor substrate 100 according to Example 1 are shown in Table 2. As shown in Table 2, the warp amount of the semiconductor substrate 500 according to Comparative example 1 was 12 μm before epitaxial-growing the semiconductor crystal layer 501, and 17 μm after epitaxial-growing the semiconductor crystal layer 501. Meanwhile, in the semiconductor substrate 100 according to Example 1, the warp amount after forming the stress relaxation layer 3 was 5 μm. Consequently, it is found that in the semiconductor substrate 100 according to Example 1, stress applied from the semiconductor crystal layer 2 to the growth substrate 1 was offset.

TABLE 2

|  | Warp amount (μm) |
| --- | --- |
| Comparative example 1 (before growth) | 12 |
| Comparative example 1 (after growth) | 17 |
| Example 1 | 5 |

Comparative Example 2

Figure 17:
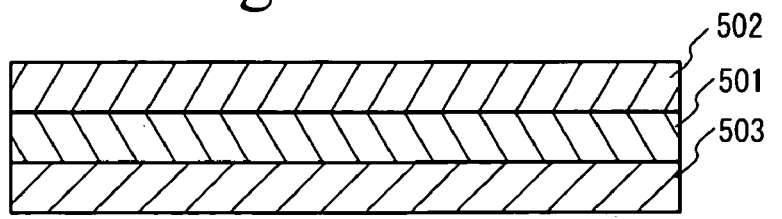
FIG. 17 is a typical cross section of a traditional semiconductor substrate.

Subsequently, as Comparative example 2, a traditional semiconductor substrate 500a was fabricated. FIG. 17 is a typical cross section of the traditional semiconductor substrate 500a. As shown in FIG. 17, the semiconductor crystal layer 502 made of Al, Ga, In, and N was epitaxial-grown on the growth substrate 501 made of SiC by MOCVD method. A stress relaxation layer 503 was formed on the bottom face of the growth substrate 501 by sputtering.

(Analysis)

In the step of fabricating transistors by using the semiconductor substrate 100 according to Example 1 and the semiconductor substrate 200a according to Comparative example 2, whether peeling is generated or not between the growth substrate and the stress relaxation layer was examined. Each 50 pcs of samples of the semiconductor substrate 100 according to Example 1 and the semiconductor substrate 500a according to Comparative example 2 were fabricated. Transistors were fabricated by these samples. The results are shown in Table 3.

TABLE 3

| | In the step of fabricating transistors | In the step of wiring |
|---|---|---|
| Example 1 | 0/50 | 0/50 |
| Comparative example 2 | 5/50 | 17/45 |

As shown in Table 3, in the step of fabricating transistors using the semiconductor substrate 500a according to Comparative example 2, peeling was generated between the growth substrate 501 and the stress relaxation layer 503 in 5 samples thereof. Further, in the step of wiring for remaining 45 samples thereof, peeling was generated between the growth substrate 501 and the stress relaxation layer 503 in 17 samples thereof.

Meanwhile, in the step of fabricating transistors using the semiconductor substrate 100 according to Example 1, peeling was not generated between the growth substrate 1 and the stress relaxation layer 3. Further, in the step of wiring, peeling was not generated between the growth substrate 1 and the stress relaxation layer 3 as well.

In result, it is found that by forming the stress relaxation layer 3 to the side face of the growth substrate 1 and the side face of the semiconductor crystal layer 2, peeling between the growth substrate 1 and the stress relaxation layer 3 in the step of fabricating the transistor is prevented. Therefore, when a transistor is fabricated by using the semiconductor substrate 100 according to Example 1, warp of the semiconductor substrate 100 and generation of cracks can be also effectively inhibited. Consequently, it is found that the yield ratio is significantly improved.

As described above, according to an aspect of the present invention, a semiconductor substrate includes: a semiconductor crystal layer grown on one face of a substrate; and a stress relaxation layer, which is formed on the other face of the substrate opposite to the one face and is formed on the side face of the substrate continuously from the other face of the substrate, and gives stress to the substrate in the same direction as the direction of stress which the semiconductor crystal layer gives to the substrate.

In the semiconductor substrate, stress is given from the stress relaxation layer to the substrate in the same direction as the direction of stress which the semiconductor crystal layer gives to the substrate. In this case, stress of the semiconductor crystal layer to the substrate is offset. Thereby, warp of the semiconductor substrate according to the present invention and generation of cracks are inhibited. Therefore, it is possible to prevent dimensional variation of exposure of the whole semiconductor substrate when a device pattern is formed on the semiconductor substrate by lithography or the like. In result, a high detailed device pattern can be formed on the semiconductor substrate according to the present invention. Further, generation of peeling of the semiconductor crystal layer can be inhibited.

Further, since the stress relaxation layer is formed to the side face of the substrate and the side face of the semiconductor crystal layer, stress of the semiconductor crystal layer to the substrate can be more effectively inhibited. Further, peeling at the interface between the substrate and the semiconductor crystal layer can be effectively prevented. Therefore, the yield ratio in manufacturing the semiconductor device by using the semiconductor substrate is significantly improved.

The semiconductor crystal layer may be a GaN-based semiconductor layer. The substrate may be GaN, SiC, or sapphire. The stress relaxation layer may be SiN, WSi, TiW, TiN, or GaN.

A manufacturing method of a semiconductor substrate according to the present invention includes the steps of: growing a semiconductor crystal layer on one face of a substrate; and forming a stress relaxation layer on the other face of the substrate opposite to said one face and on a side face of the substrate continuously from the other face of the substrate, the stress relaxation layer applying stress to the substrate in the same direction as the direction of stress which the semiconductor crystal layer applies to the substrate.

In the manufacturing method of a semiconductor substrate according to the present invention, the semiconductor crystal layer is grown on one face of the substrate, and the stress relaxation layer, which gives stress to the substrate in the same direction as the direction of stress which the semiconductor crystal layer gives to the substrate is formed on the other face and the side face of the substrate. In this case, stress is applied from the stress relaxation layer to the substrate in the same direction as the direction of stress which the semiconductor crystal layer gives to the substrate. Thereby, warp of the semiconductor substrate according to the present invention and generation of cracks are inhibited. Therefore, it is possible to prevent dimensional variation of exposure of the whole substrate when a device pattern is formed on the semiconductor substrate by lithography or the like. In result, a high detailed device pattern can be formed on the semiconductor substrate according to the present invention. Further, generation of peeling of the semiconductor crystal layer can be inhibited.

Further, since the stress relaxation layer is formed to the side face of the substrate and the side face of the semiconductor crystal layer, stress of the semiconductor crystal layer to the substrate can be more effectively inhibited. Further, peeling at the interface between the substrate and the semiconductor crystal layer can be effectively prevented. Therefore, the yield ratio in manufacturing the semiconductor device by using the semiconductor substrate according to the present invention is significantly improved.

The semiconductor crystal layer may be a GaN-based semiconductor layer. The substrate may be GaN, SiC, or sapphire. The stress relaxation layer may be SiN, WSi, TiW, TiN, or GaN.

A substrate for semiconductor crystal growth according to the present invention includes: a stress relaxation layer that is formed on an other face opposite to one face of the substrate and is formed on a side face of the substrate continuously from the other face of the substrate, the stress relaxation layer applying stress to the substrate for a semiconductor crystal layer in the same direction as the direction of stress from the semiconductor crystal layer formed on the other one face of the substrate.

In the substrate for semiconductor crystal growth according to the present invention, stress is given from the stress relaxation layer to the substrate for semiconductor crystal growth in the same direction as the direction of stress which the semiconductor crystal layer gives to the substrate for semiconductor crystal growth. In this case, stress of the semiconductor crystal layer to the substrate for semiconductor crystal growth is offset. Thereby, warp of the semiconductor substrate using the substrate for semiconductor crystal growth according to the present invention is inhibited. Therefore, it is possible to prevent dimensional variation of exposure of the whole semiconductor substrate when a device pattern is formed on the semiconductor crystal layer by lithography or the like. Further, since the stress relaxation layer is formed to the side face of the substrate, stress of the semiconductor crystal layer to the substrate can be more effectively inhibited. Further, generation of peeling of the semiconductor crystal layer can be inhibited.

The semiconductor crystal layer may be a GaN-based semiconductor layer. The substrate may be GaN, SiC, or sapphire. The stress relaxation layer may be SiN, WSi, TiW, TiN, or GaN.

A manufacturing method of a substrate for semiconductor crystal growth according to the present invention includes the step of: forming a stress relaxation layer that is formed on an other face opposite to one face of the substrate and is formed on a side face of the substrate continuously from the other face of the substrate, the stress relaxation layer applying stress to the substrate for a semiconductor crystal layer in the same direction as the direction of stress from the semiconductor crystal layer formed on the one face of the substrate.

In the manufacturing method of a substrate for semiconductor crystal growth according to the present invention, the stress relaxation layer which gives stress to the substrate for semiconductor crystal growth in the same direction as the direction of stress which the semiconductor crystal layer gives to the substrate for semiconductor crystal growth is formed on the other face of the substrate for semiconductor crystal growth with one face on which the semiconductor crystal layer shall be grown and on the side face of the substrate. In this case, stress is given from the stress relaxation layer to the substrate for semiconductor crystal growth in the same direction as the direction of stress which the semiconductor crystal layer gives to the substrate for semiconductor crystal growth. Thereby, warp of the semiconductor substrate using the substrate for semiconductor crystal growth according to the present invention is inhibited. Therefore, it is possible to prevent dimensional variation of exposure of the whole semiconductor substrate when a device pattern is formed on the semiconductor crystal layer by lithography or the like. Further, since the stress relaxation layer is formed to the side face of the substrate, stress of the semiconductor crystal layer to the substrate can be more effectively inhibited. Further, generation of peeling of the semiconductor crystal layer can be inhibited.

The semiconductor crystal layer may be a GaN-based semiconductor layer. The substrate may be GaN, SiC, or sapphire. The stress relaxation layer may be SiN, WSi, TiW, TiN, or GaN.

A semiconductor device according to the present invention includes: a semiconductor crystal layer, which is provided on one face of a substrate and becomes an operating layer of a field effect transistor; and a stress relaxation layer, which is provided on the other face of the substrate divided into a chip and is provided on the side face of the substrate continuously from the other face of the substrate, and which gives stress to the substrate in the same direction as the direction of stress which the semiconductor crystal layer gives to the substrate.

In the semiconductor device according to the present invention, stress is given from the stress relaxation layer to the substrate in the same direction as the direction of stress which the semiconductor crystal layer gives to the substrate. In this case, stress of the semiconductor crystal layer to the substrate is offset. Thereby, warp of the semiconductor device according to the present invention and generation of cracks are inhibited. Further, since the stress relaxation layer is formed to the side face of the substrate, stress of the semiconductor crystal layer to the substrate can be more effectively inhibited. Further, when warp of the semiconductor device can be inhibited, change of electron state of the semiconductor crystal layer can be inhibited. Thereby, the characteristics of the semiconductor device according to the present invention are improved, and desired characteristics are realized. Further, generation of peeling of the semiconductor crystal layer can be inhibited.

The semiconductor crystal layer may be a GaN-based semiconductor layer. The substrate may be GaN, SiC, or sapphire. The stress relaxation layer may be SiN, WSi, TiW, TiN, or GaN.

A manufacturing method of a semiconductor device according to the present invention includes the step of: forming a stress relaxation layer, which applies stress to a substrate in the same direction as the direction of stress which a semiconductor crystal layer applies to the substrate, on the other face of the substrate opposite to one face thereof and on a region defining a side face when the substrate is divided into chips, the other face of the substrate being provided with the semiconductor crystal layer to become an operating layer of a field effect transistor.

In the manufacturing method of a semiconductor device according to the present invention, the stress relaxation layer, which gives stress to the substrate in the same direction as the direction of stress which the semiconductor crystal layer gives to the substrate is formed on the other face of the substrate with one face on which the semiconductor crystal layer to become an operating layer of a field effect transistor is to be provided and on a region defining a side face when the substrate is divided into chips. In this case, stress is applied from the stress relaxation layer to the substrate in the same direction as the direction of stress which the semiconductor crystal layer gives to the substrate. Thereby, warp of the semiconductor device according to the present invention and generation of cracks are inhibited. Further, since the stress relaxation layer is formed to the side face of the substrate, stress of the semiconductor crystal layer to the substrate can be more effectively inhibited. Further, when warp of the semiconductor device can be inhibited, change of electron state of the semiconductor crystal layer can be inhibited. Thereby, the characteristics of the semiconductor device according to the present invention are improved, and desired characteristics are realized. Further, generation of peeling of the semiconductor crystal layer can be inhibited.

Grooves may be formed on the other face of the substrate, and the stress relaxation layer may be provided on the other face of the substrate and on an inner wall of the grooves. In this case, forming the stress relaxation layer in the region defining the side face of the semiconductor device when the semiconductor device is divided into chips is facilitated. Further, the semiconductor device may be divided into chips by cutting the one face of the substrate to the grooves. Further, the substrate may be GaN, SiC, or sapphire.

An optical semiconductor device according to the present invention includes: a semiconductor crystal layer, which is provided on one face of a substrate and includes an active layer and cladding layers sandwiching the active layer in between; and a stress relaxation layer, which is provided on the other face of the substrate divided into a chip and is provided on the side face of the substrate continuously from the other face of the substrate, and gives stress to the substrate in the same direction as the direction of stress which the semiconductor crystal layer gives to the substrate.

In the optical semiconductor device according to the present invention, stress is given from the stress relaxation layer to the substrate in the same direction as the direction of stress which the semiconductor crystal layer gives to the substrate. In this case, stress of the semiconductor crystal layer to the substrate is offset. Thereby, warp of the optical semiconductor device according to the present invention and generation of cracks are inhibited. Further, since the stress relaxation layer is formed to the side face of the substrate, stress of the optical semiconductor crystal layer to the substrate can be more effectively inhibited. Further, when warp is inhibited, the optical semiconductor device according to the present invention has high precision as a resonator. Further, generation of peeling of the semiconductor crystal layer can be inhibited.

The semiconductor crystal layer may be a GaN-based semiconductor layer. The substrate may be GaN, SiC, or sapphire. The stress relaxation layer may be SiN, WSi, TiW, TiN, or GaN.

A manufacturing method of an optical semiconductor device according to the present invention includes the step of forming a stress relaxation layer, which applies stress to a substrate in the same direction as the direction of stress which a semiconductor crystal layer applies to the substrate, on the other face of the substrate and the other face of the semiconductor is provided with an active layer and cladding layers where the active layer is placed between the cladding layers in a vertical direction and on a region defining a side face when the substrate is divided into chips.

In the manufacturing method of an optical semiconductor device according to the present invention, the stress relaxation layer, which gives stress to the substrate in the same direction as the direction of stress which the semiconductor crystal layer gives to the substrate is formed on the other face of the substrate with one face on which the semiconductor crystal layer including the active layer and the cladding layers sandwiching the active layer in between is provided and on the region defining the side face obtained when the substrate is divided into chips. In this case, stress is applied from the stress relaxation layer to the substrate in the same direction as the direction of stress which the semiconductor crystal layer gives to the substrate. Thereby, warp of the optical semiconductor device according to the present invention and generation of cracks are inhibited. Further, since the stress relaxation layer is formed to the side face of the substrate, stress of the semiconductor crystal layer to the substrate can be more effectively inhibited. Further, when warp is inhibited, the optical semiconductor device according to the present invention has high precision as a resonator. Further, generation of peeling of the semiconductor crystal layer can be inhibited.

Grooves may be formed on the other face of the substrate, and the stress relaxation layer may be provided on the other face of the substrate and on an inner wall of the grooves. In this case, forming the stress relaxation layer in the region defining the side face of the optical semiconductor device when the optical semiconductor device is divided into chips is facilitated. The optical semiconductor device may be divided into chips by cutting the one face of the substrate to the grooves. The substrate may be GaN, SiC, or sapphire.

The present invention is not limited to the above-mentioned embodiments, and other embodiments, variations and modifications may be made without departing from the scope of the present invention.

The present invention is based on Japanese Patent Application No. 2005-100248 filed on Mar. 30, 2005, the entire disclosure of which is hereby incorporated by reference.

What is claimed is:

1. A semiconductor substrate comprising:
   a semiconductor crystal layer grown on one face of a substrate; and
   a stress relaxation layer, which is formed on the other face of the substrate opposite to said one face and is formed on a side face of the substrate continuously from the other face of the substrate, the stress relaxation layer giving stress to the substrate in the same direction as the direction of stress which the semiconductor crystal layer applies to the substrate.

2. The semiconductor substrate according to claim 1, wherein the semiconductor crystal layer is a GaN-based semiconductor layer.

3. The semiconductor substrate according to claim 1, wherein the substrate is GaN, SiC, or sapphire.

4. The semiconductor substrate according to claim 1, wherein the stress relaxation layer is SiN, WSi, TiW, TiN, or GaN.

5. A substrate for semiconductor crystal growth comprising:
   a stress relaxation layer that is formed on an other face opposite to one face of the substrate and is formed on a side face of the substrate continuously from the other face of the substrate, the stress relaxation layer applying stress to the substrate for a semiconductor crystal layer in the same direction as the direction of stress from the semiconductor crystal layer formed on the one face of the substrate 6. The substrate for semiconductor crystal growth according to claim 5, wherein the semiconductor crystal layer is a GaN-based semiconductor layer.

7. The substrate for semiconductor crystal growth according to claim 5, wherein the substrate is GaN, SiC, or sapphire.

8. The substrate for semiconductor crystal growth according to claim 5, wherein the stress relaxation layer is SiN, WSi, TiW, TiN, or GaN.

9. A semiconductor device comprising:
   a semiconductor crystal layer, which is provided on one face of a substrate and becomes an operating layer of a field effect transistor; and
   a stress relaxation layer, which is provided on the other face of the substrate opposite to said one face divided into a chip and is provided on the side face of the substrate continuously from the other face of the substrate, and which applies stress to the substrate in the same direction as the direction of stress which the semiconductor crystal layer applies to the substrate.

10. The semiconductor device according to claim 9, wherein the semiconductor crystal layer is a GaN-based semiconductor layer.

11. The semiconductor device according to claim 9, wherein the substrate is GaN, SiC, or sapphire.

12. The semiconductor device according to claim 9, wherein the stress relaxation layer is SiN, WSi, TiW, TiN, or GaN.

13. An optical semiconductor device comprising:
   a semiconductor crystal layer, which is provided on one face of a substrate and includes an active layer and cladding layers sandwiching the active layer in between; and
   a stress relaxation layer, which is provided on the other face of the substrate divided into a chip and is provided on the side face of the substrate continuously from the other face of the substrate opposite to said one face, and applies stress to the substrate in the same direction as the direction of stress which the semiconductor crystal layer applies to the substrate.

14. The optical semiconductor device according to claim 13, wherein the semiconductor crystal layer is a GaN-based semiconductor layer.

15. The optical semiconductor device according to claim 13, wherein the substrate is GaN, SiC, or sapphire.

16. The optical semiconductor device according to claim 13, wherein the stress relaxation layer is SiN, WSi, TiW, TiN, or GaN.

* * * * *